United States Patent
Yanai et al.

(10) Patent No.: US 6,847,096 B2
(45) Date of Patent: Jan. 25, 2005

(54) SEMICONDUCTOR WAFER HAVING DISCHARGE STRUCTURE TO SUBSTRATE

(75) Inventors: Tetsuro Yanai, Tokyo (JP); Hiroaki Kumagai, Miyagi (JP); Takehiro Hirano, Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 82 days.

(21) Appl. No.: 10/286,881

(22) Filed: Nov. 4, 2002

(65) Prior Publication Data

US 2003/0181064 A1 Sep. 25, 2003

(30) Foreign Application Priority Data

Mar. 25, 2002 (JP) ........................................ 2002-083343

(51) Int. Cl.[7] .......................................... H01L 23/544
(52) U.S. Cl. ...................... 257/620; 257/48; 257/773; 257/774; 438/401; 438/462
(58) Field of Search ...................... 257/48, 355, 758, 257/773, 774, 620; 438/401, 462

(56) References Cited

U.S. PATENT DOCUMENTS

| | | | | |
|---|---|---|---|---|
| 6,236,073 B1 | * | 5/2001 | Hsu | 257/213 |
| 6,627,917 B1 | * | 9/2003 | Fenner et al. | 257/48 |
| 2001/0010964 A1 | * | 8/2001 | Geissler et al. | 438/381 |
| 2002/0158348 A1 | * | 10/2002 | Petrucci et al. | 257/797 |
| 2003/0030129 A1 | * | 2/2003 | Terada et al. | 257/618 |

* cited by examiner

*Primary Examiner*—Tom Thomas
*Assistant Examiner*—Matthew E. Warren
(74) *Attorney, Agent, or Firm*—Volentine Francos & Whitt, PLLC

(57) ABSTRACT

To prevent an abnormal discharge phenomenon from occurring due to charge build up on conductive layer region that has a large surface area and that is a region other than the region where a semiconductor device is formed on a semiconductor substrate, the semiconductor substrate structure being made to have an electrical connection between the conductive layer region having a large surface area and the semiconductor substrate.

15 Claims, 3 Drawing Sheets

SEMICONDUCTOR WAFER HAVING DISCHARGE STRUCTURE TO SUBSTRATE

BACKGROUND OF THE INVENTION

The present invention relates to a semiconductor substrate structure and a semiconductor device.

With a related semiconductor substrate structure, a conductive layer, where there is no pattern of a semiconductor device on a semiconductor substrate, and having a larger surface area at the outer periphery of the semiconductor substrate than an internal pattern, exists and this conductive layer is often not electrically connected to the semiconductor substrate. For example, a pattern of a semiconductor device is not formed on the portion where a manufacturing lot number is stamped for identifying a wafer so that the lot number can be read easily. With this structure, a conductive layer is therefore effectively not electrically connected with a semiconductor substrate (refer to FIG. 1 and FIG. 2).

With the above structure, when a semiconductor device is exposed to the atmosphere for plasma etching during its manufacture, a charge is built up on its conductive layer insulated from the semiconductor substrate, and in some cases an abnormal discharge is generated on the conductive layer. Such an abnormal discharge phenomenon on a conductive layer often generates particles on the semiconductor substrate. The particles due to this abnormal discharge inhibit patterning of a semiconductor device, and further cause significant drop in yield. It also causes a significant decrease in productivity because the particles caused by the abnormal discharge prevent a manufacturing lot number stamped on a wafer from being read. Solving the abnormal discharge phenomena on this conductive layer has been a big problem.

SUMMARY OF THE INVENTION

In order to solve this problem, the present invention provides electrical connection between a conductive layer and a semiconductor substrate by forming the same pattern of contact holes as a pattern of a semiconductor device on the portions where a conductive layer has a large surface area within the semiconductor substrate. In order to enable reading of an identification number and manufacturing lot number, it is made possible to form patterns of contact hole without transferring a pattern of a conductive layer.

Further, a conductive layer having a large surface area within a semiconductor device is connected with a semiconductor substrate electrically via contact holes.

DETAILED DESCRIPTION OF THE PREFERRED EMBODIMENTS

Figure 1:
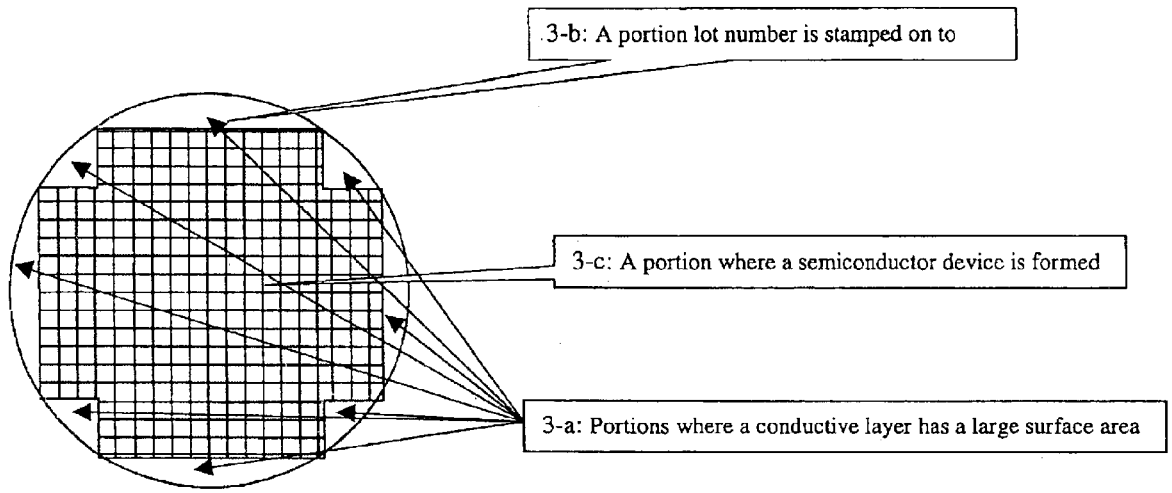
FIG. 1 is a schematic view of a semiconductor substrate of the related art.
Figure 2:
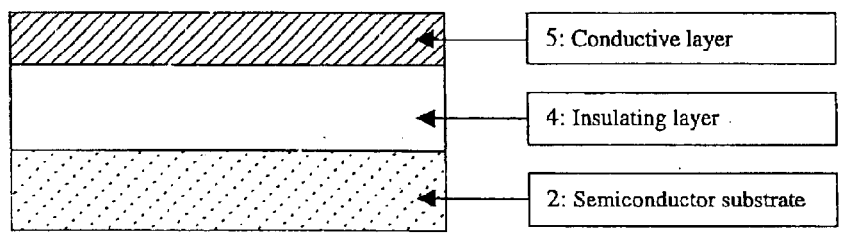
FIG. 2 is a cross section taken at section 3-$a$ in FIG. 1.
Figure 4:
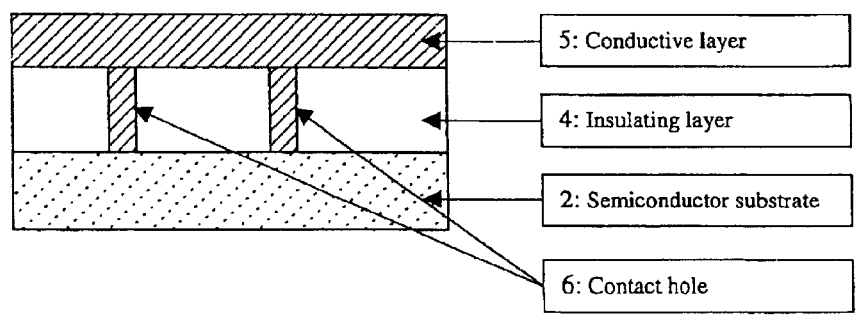
FIG. 4 is a cross section taken at section 1-$a$ in FIG. 3.
Figure 3:
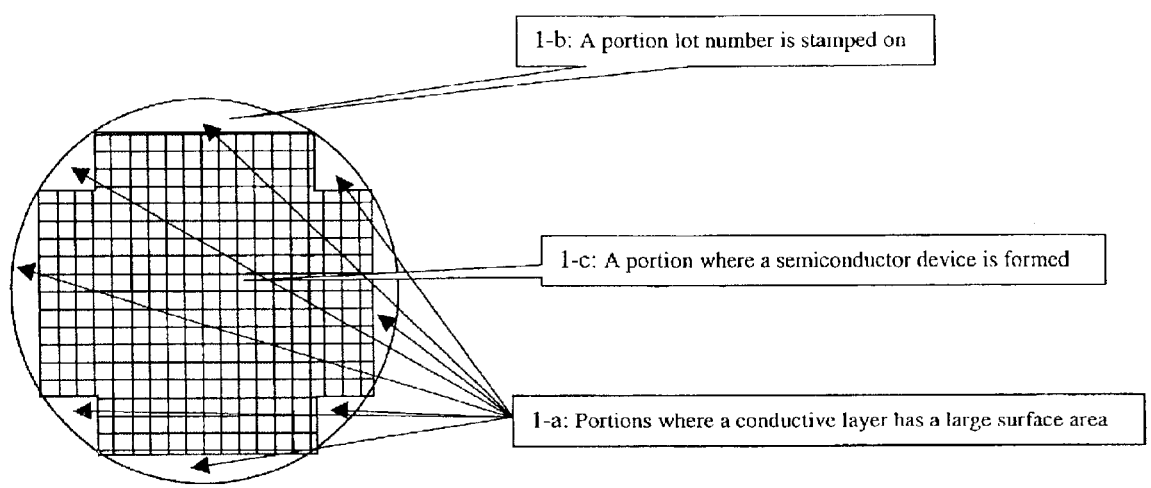
FIG. 3 is a schematic view of a wafer of the present invention.

A semiconductor device is generally manufactured by forming elements such as transistors etc. on a semiconductor substrate, forming an insulating layer thereon, making contact holes and then forming a pattern of a wiring layer. 1-$c$ in FIG. 3 is a section where a semiconductor device is formed.

Due to the shape of the semiconductor device tip being square, some portions with no pattern will appear at the periphery of the semiconductor substrate. 1-$a$ in FIG. 3 is sections where a conductive layer has a large surface area. The structure of these portions is a structure where an insulating film with no pattern and a wiring layer with no pattern are on a semiconductor substrate 2 with no pattern.

In many cases, this wiring layer with no pattern has a larger surface area than the surface area of the semiconductor device inside.

The present invention provides a structure of a semiconductor substrate where the semiconductor substrate is electrically connected with a conductive layer having a large surface area via contact holes by forming only contact holes on this portion.

Namely, in the same steps of manufacturing an element of a semiconductor device, after forming an insulating film 4, contact holes 6 are also formed in the portions 1-$a$ where a conductive layer has a large surface area and then a conductive layer 5 is formed on the semiconductor substrate 2.

Since it becomes a structure such that the semiconductor substrate 2 and this conductive layer 1-$a$ are electrically connected by forming the same contact pattern under the conductive layer 1-$a$ having a large surface area as the semiconductor device, even if a semiconductor device is exposed to charged particles such as plasma etching during its manufacture, this conductive layer can release the charge to the semiconductor substrate 2. The charge is therefore not built up. As a result, abnormal discharge is prevented from occurring and the yield is improved.

Only a contact pattern, but no pattern of a conductive layer of a semiconductor device, is formed on a lot number stamping portion 1-$b$, so that reading of the lot number is not hindered and can be used as before. However, no special process needs to be added because the conductive layer 5 can be formed without forming a pattern.

Further, the present invention can be applied to the inside of a semiconductor device. For example, there is a case (not shown) where a conductive layer having large surface area is not connected to a semiconductor substrate while a semiconductor device is being manufactured. An abnormal discharge easily occurs also in this case. An abnormal discharge can be prevented from occurring by having a structure such that contact holes are previously formed on the conductive layer portion and connected with a semiconductor substrate in order that such a large conductive layer which is not connected to a semiconductor substrate does not exist. This therefore prevents the generation of particles and the yield is improved.

Further, the present invention can be realized even if a number of layers of a conductive layer increases. The manufacturing method will be described below with reference to an example of two-layer wiring.

Figure 5:
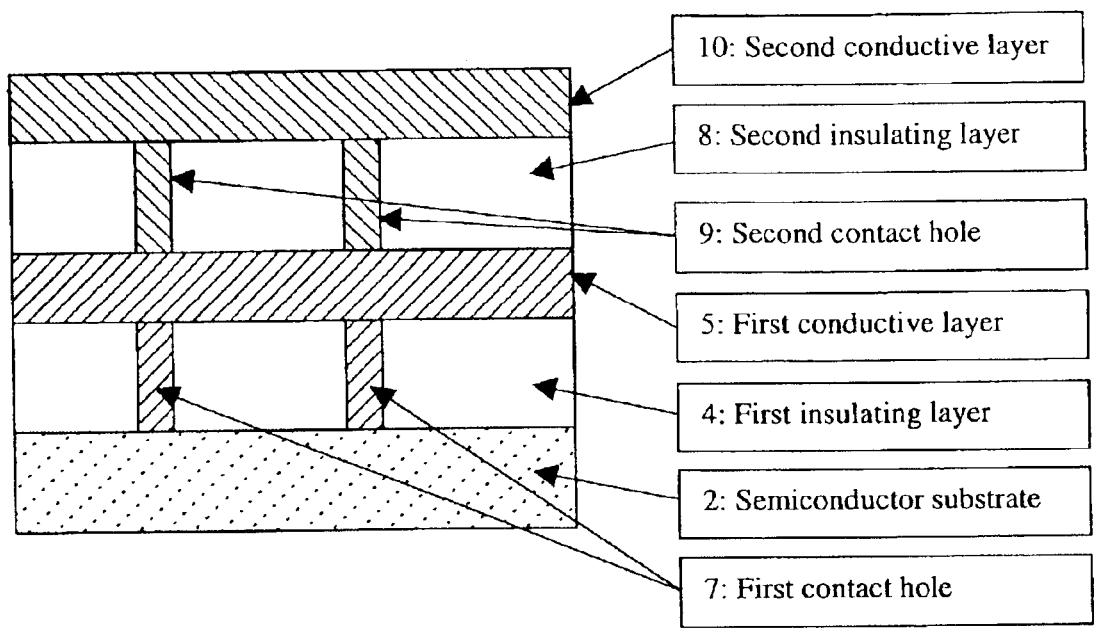
FIG. 5 is a cross section of two-layer wiring of the present invention.

FIG. 5 shows a cross-sectional structure of a semiconductor substrate formed using this manufacturing method. First of all, a prescribed element is formed on a semiconductor substrate 2, a first insulating layer 4 is formed and then first contact holes 7 are formed in the portions where a conductive layer has a large surface area around the periphery of a wafer. After that, a first conductive layer 5 is formed and then a second insulating layer 8 is formed.

Next, second contact holes 9 are also formed around the periphery of the wafer. After that, a second insulating layer

10 is formed. With this semiconductor substrate structure, both of the first conductive layer 5 having a large surface area and the second conductive layer 10 having a large surface area can be electrically connected to the semiconductor substrate 2.

Even if more than three conductive layers are formed, the structure of the present invention can be realized using the same method. Also, a conductive layer is not affected by materials such as aluminum, tungsten, polysilicon, etc.

As described in detail above, the present invention provides a structure where a conductive layer, on a semiconductor substrate having a large surface area where a semiconductor device is not formed, and the semiconductor substrate are electrically connected, so that charge can be released to the semiconductor substrate without being built up on the conductive layer having a large surface area. Such a semiconductor substrate structure can has a significant effect of preventing abnormal discharge of particles from occurring and the yield is improved.

Similarly, for the structure of the semiconductor device formed on the semiconductor substrate, in order that a large conductive layer which is not connected the semiconductor substrate does not exist, contact holes are formed on this conductive layer portion to have connection with the semiconductor substrate so that an abnormal discharge can be prevented from occurring. As a result, particles can be prevented from occurring and the yield is improved.

What is claimed is:

1. A semiconductor wafer comprising:
    a semiconductor substrate having a main surface, the main surface including a first area which is used for making a plurality of semiconductor chips, and a second area which is located at a periphery of the first area and which is not used for making the semiconductor chips;
    an insulating layer which is formed on the main surface of the semiconductor substrate in the first and second areas;
    a conductive layer which is formed on the insulating layer formed on the main surface of the semiconductor substrate in the first and second areas; and
    a contact hole which is formed through the insulating layer formed on the main surface in the second area, the conductive layer being formed in the contact hole to electrically connect the semiconductor substrate and the conductive layer.

2. The semiconductor wafer according to claim 1, wherein a portion lot number is stamped over the main surface of the semiconductor substrate in the second area.

3. The semiconductor wafer according to claim 2, wherein the conductive layer is made of aluminum.

4. The semiconductor wafer according to claim 2, wherein the conductive layer is made of tungsten.

5. The semiconductor wafer according to claim 2, wherein the conductive layer is made of polysilicon.

6. A semiconductor wafer comprising:
    a semiconductor substrate having a main surface, the main surface including a first area on which semiconductor devices are formed, and a second area which is located at a periphery of the first area and wherein semiconductor devices are not formed;
    an insulating layer which is formed on the main surface of the semiconductor substrate over the first and second areas;
    a conductive layer which is formed on the insulating layer formed on the main surface of the semiconductor substrate over the first and second areas; and
    a contact hole which is formed through the insulating layer over the second area, the conductive layer being formed in the contact hole to provide an electrical discharge path between the semiconductor substrate and the conductive layer.

7. The semiconductor wafer according to claim 6, wherein a portion lot number is stamped over the main surface of the semiconductor substrate over the second area.

8. The semiconductor wafer according to claim 6, wherein the conductive layer is made of aluminum.

9. The semiconductor wafer according to claim 6, wherein the conductive layer is made of tungsten.

10. The semiconductor wafer according to claim 6, wherein the conductive layer is made of polysilicon.

11. A semiconductor wafer comprising:
    a semiconductor substrate having a main surface, the main surface including a first area on which semiconductor devices are formed, and a second area which is located at a periphery of the first area and wherein semiconductor devices are not formed;
    a first insulating layer which is formed on the main surface of the semiconductor substrate over the first and second areas;
    a first conductive layer which is formed on the first insulating layer over the first and second areas;
    first contact holes which are formed through the first insulating layer over the second area, the first conductive layer being formed in the first contact holes to electrically connect the semiconductor substrate and the first conductive layer;
    a second insulating layer which is formed on the first conductive layer over the first and second areas;
    a second conductive layer which is formed on the second insulating layer over the first and second areas; and
    second contact holes which are formed through the second insulating layer over the second area, the second conductive layer being formed in the second contact holes to electrically connect the first and second conductive layers.

12. The semiconductor wafer according to claim 11, wherein a portion lot number is stamped on the second conductive layer over the second area.

13. The semiconductor wafer according to claim 11, wherein the first and second conductive layers are made of aluminum.

14. The semiconductor wafer according to claim 11, wherein the first and second conductive layers are made of tungsten.

15. The semiconductor wafer according to claim 11, wherein the first and second conductive layers are made of polysilicon.

* * * * *